(12) United States Patent
Oh et al.

(10) Patent No.: US 8,741,539 B2
(45) Date of Patent: Jun. 3, 2014

(54) HARDMASK COMPOSITION, METHOD OF FORMING A PATTERN USING THE SAME, AND SEMICONDUCTOR INTEGRATED CIRCUIT DEVICE INCLUDING THE PATTERN

(75) Inventors: Seung-Bae Oh, Uiwang-si (KR);
Hwan-Sung Cheon, Uiwang-si (KR);
Sung-Wook Cho, Uiwang-si (KR);
Min-Soo Kim, Uiwang-si (KR);
Jee-Yun Song, Uiwang-si (KR);
Yoo-Jeong Choi, Uiwang-si (KR)

(73) Assignee: Cheil Industries, Inc., Gumi-Si, Kyeongsangbuk-Do (KR)

( * ) Notice: Subject to any disclaimer, the term of this patent is extended or adjusted under 35 U.S.C. 154(b) by 50 days.

(21) Appl. No.: 13/241,332

(22) Filed: Sep. 23, 2011

(65) Prior Publication Data
US 2012/0153424 A1 Jun. 21, 2012

(30) Foreign Application Priority Data
Dec. 17, 2010 (KR) .................... 10-2010-0129982

(51) Int. Cl.
*G03F 7/00* (2006.01)
*G03F 7/004* (2006.01)
*G03F 7/11* (2006.01)
*G03F 7/40* (2006.01)

(52) U.S. Cl.
USPC ............. 430/270.1; 430/271.1; 430/322; 430/331

(58) Field of Classification Search
USPC .................. 430/270.1, 913, 271.1
See application file for complete search history.

(56) References Cited

U.S. PATENT DOCUMENTS

| | | | | |
|---|---|---|---|---|
| 3,276,868 A | * | 10/1966 | Uhlig | 430/60 |
| 4,399,021 A | * | 8/1983 | Gillich et al. | 205/50 |
| 4,427,765 A | * | 1/1984 | Mohr et al. | 430/525 |
| 5,059,708 A | * | 10/1991 | Aruga et al. | 558/214 |
| 5,196,296 A | | 3/1993 | Watanabe et al. | |
| 5,300,397 A | * | 4/1994 | Aoshima | 430/176 |
| 5,310,808 A | * | 5/1994 | Grey et al. | 525/287 |
| 6,558,796 B2 | * | 5/2003 | Huybrechts et al. | 428/414 |
| 6,828,407 B2 | * | 12/2004 | Sasaki et al. | 528/86 |
| 6,835,532 B2 | | 12/2004 | Jung | |
| 7,829,638 B2 | | 11/2010 | Uh et al. | |
| 8,022,165 B2 | * | 9/2011 | Moehwald et al. | 528/167 |
| 8,420,289 B2 | * | 4/2013 | Kim et al. | 430/270.1 |
| 2006/0251990 A1 | | 11/2006 | Uh et al. | |
| 2006/0269867 A1 | | 11/2006 | Uh et al. | |
| 2008/0153033 A1 | | 6/2008 | Hyung et al. | |
| 2008/0160461 A1 | | 7/2008 | Yoon et al. | |
| 2008/0305441 A1 | | 12/2008 | Yoon et al. | |
| 2009/0176165 A1 | | 7/2009 | Cheon et al. | |
| 2009/0253840 A1 | | 10/2009 | Mohwald et al. | |
| 2010/0021830 A1 | | 1/2010 | Kim et al. | |

FOREIGN PATENT DOCUMENTS

| | | | |
|---|---|---|---|
| CN | 101185030 A | | 5/2008 |
| CN | 101641390 A | | 2/2010 |
| EP | 190643 A2 | * | 8/1986 |
| JP | 63-273618 A | | 11/1988 |
| JP | 03-290662 A | | 12/1991 |
| JP | 03290662 A | * | 12/1991 |
| JP | 07-048424 A | | 2/1995 |
| JP | 07-098409 A | | 4/1995 |
| KR | 10-1999-0008104 A | | 1/1999 |
| KR | 10-2001-0080815 A | | 8/2001 |
| KR | 10-2004-0000190 A | | 1/2004 |
| KR | 10-2006-0116133 A | | 11/2006 |
| KR | 10-20060122449 A | | 11/2006 |
| KR | 10-2007-0002591 A | | 1/2007 |
| KR | 10-2008-0062963 A | | 7/2008 |
| KR | 10-2008-0063243 A | | 7/2008 |
| KR | 10-2008-0107210 A | | 12/2008 |
| TW | 201030054 A | | 8/2010 |
| WO | WO 2007/139268 A1 | | 12/2007 |
| WO | WO 2008/150058 A1 | | 12/2008 |

OTHER PUBLICATIONS

Abstract of JP 03-290662 (no date).*
Arisawa, et al.; Synthesis of o-(diphenylphosphinoyloxy)anilines by the rhodium-catalyzed reaction of nitroarenes and diphenylphosphine oxide; Tetrahedron Letters; Apr. 13, 2010; pp. 3116-3118; 51; Elsevier, USA.
Chinese Search Report in CN 201110306768.8, dated Mar. 8, 2013, with English translation, (Oh, et al.).
Chinese Search Report in CN 201110306768.8, dated Aug. 6, 2013, with English translation (Oh, et al.).
Search Report mailed Jan. 9, 2014 in corresponding Taiwanese Patent Application No. 100141834.

* cited by examiner

*Primary Examiner* — Amanda C. Walke
(74) *Attorney, Agent, or Firm* — Lee & Morse, P.C.

(57) ABSTRACT

A hard mask composition, a method of forming a pattern, and a semiconductor integrated circuit device, the hard mask composition including a solvent; and a compound, the compound including a structural unit represented by the following Chemical Formula 1:

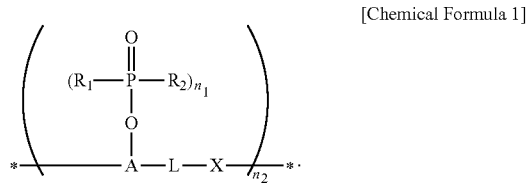

[Chemical Formula 1]

16 Claims, No Drawings

HARDMASK COMPOSITION, METHOD OF FORMING A PATTERN USING THE SAME, AND SEMICONDUCTOR INTEGRATED CIRCUIT DEVICE INCLUDING THE PATTERN

BACKGROUND

1. Field of the Invention

Embodiments relate to a hard mask composition, a method of forming a pattern using the same, and a semiconductor integrated circuit device including the pattern.

2. Description of the Related Art

In industrial fields including microelectronics manufacturing as well as microscopic structure manufacturing, e.g., micromachines, magnetoresist heads, etc., chips including many circuits with a decreased size of patterns are desirable.

An effective lithography technique is desirable for decreasing the size of patterns. Lithography affects the fabrication of a microscopic structure not only in terms of directly imaging a pattern on a predetermined substrate but also in terms of fabricating a mask typically used in pattern formation.

A typical lithography process may include a process of forming a patterned resist layer by exposing a radiation-sensitive resist to an imaging radiation ray. Then, a pattern image is obtained by developing the exposed resist layer with a development solution. A pattern is then transferred onto an underlying material by etching the material through an opening of the patterned resist layer. After the transfer of the pattern, the remaining resist layer is removed.

However, in some lithography imaging processes, the resist layer may not provide sufficient resistance to effectively transfer a predetermined pattern to the layer under the resist in the subsequent etching process.

Therefore, when, e.g., an ultrathin film resist layer is needed, when the layer (under the hard mask layer) to be etched is thick, when an etching depth is large, and/or when a particular etchant is used for the layer under the hard mask layer, a hard mask layer may be used as an intermediate layer between the resist layer and the material layer to be patterned through transfer from the patterned resist.

The hard mask layer may accommodate the pattern from the patterned resist layer and may be resistant against an etching process for transferring the pattern onto the material layer.

SUMMARY

Embodiments are directed to a hard mask composition, a method of forming a pattern using the same, and a semiconductor integrated circuit device including the pattern.

The embodiments may be realized by providing a hard mask composition including a solvent; and a compound including a structural unit represented by the following Chemical Formula 1:

[Chemical Formula 1]

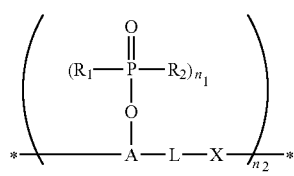

wherein, in Chemical Formula 1, A is —CH— or a polyvalent aromatic ring group, X is a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, L is a single bond, a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $R_1$ and $R_2$ are each independently hydrogen, a hydroxyl group, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, and $n_1$ is an integer of 1 to 6, and $n_2$ is 1 to about 190.

A may be one selected from substituted or unsubstituted aromatic ring groups shown in the following Group 1:

[Group 1]

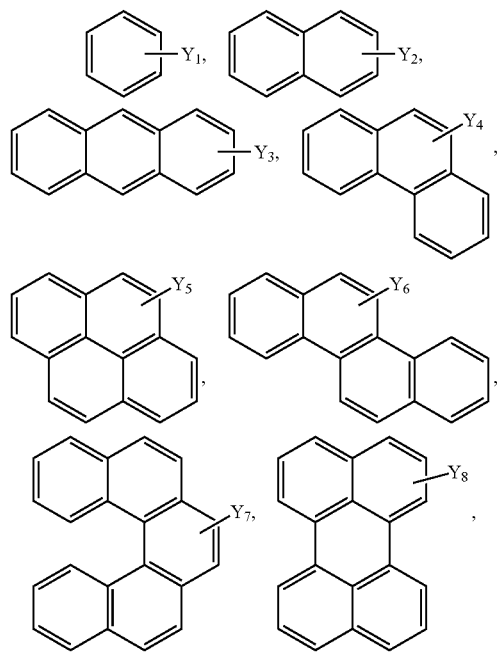

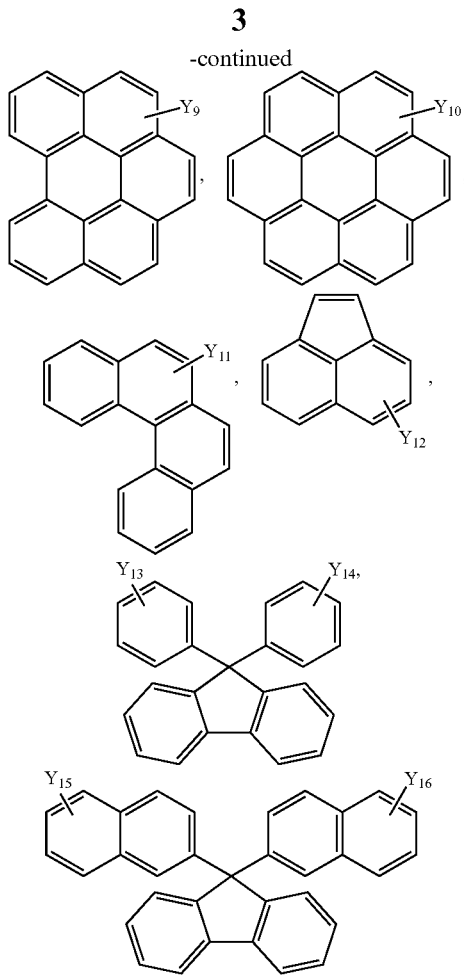

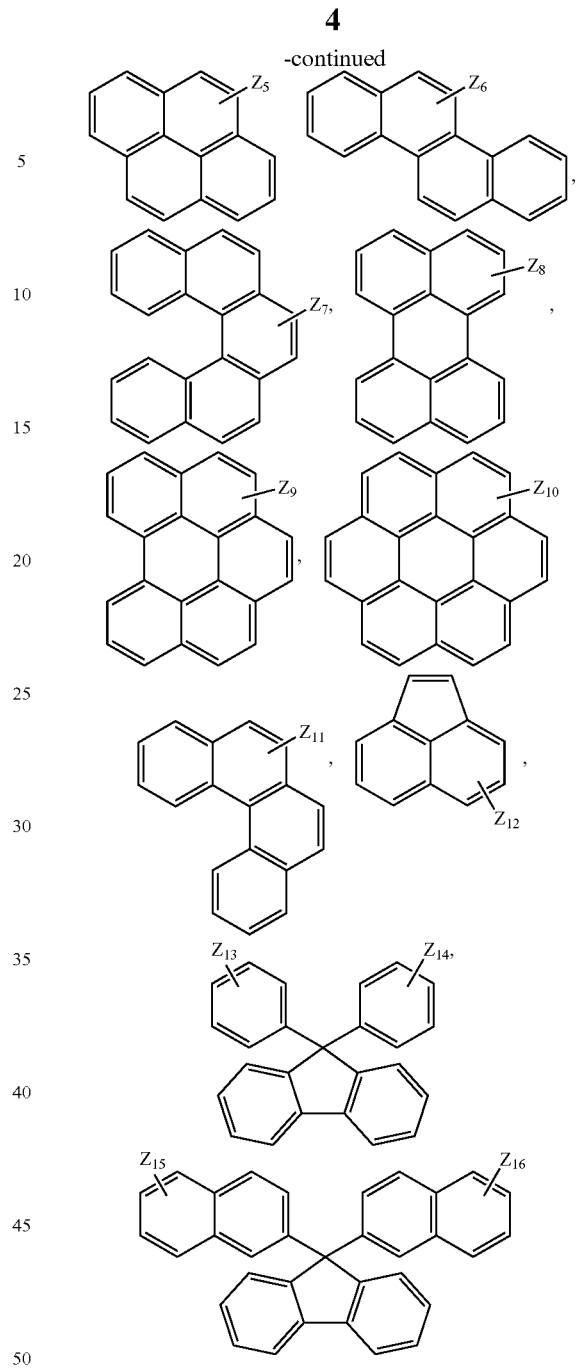

wherein, in Group 1, $Y_1$ to $Y_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

X may be one selected from substituted or unsubstituted aromatic ring groups shown in the following Group 2:

[Group 2]

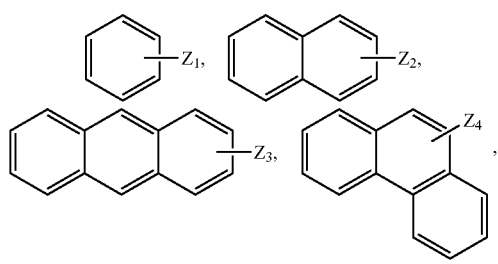

wherein in Group 2, $Z_1$ to $Z_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

The compound may have a weight average molecular weight of about 2,000 to about 10,000.

The compound may be included in the composition in an amount of about 1 wt % to about 20 wt %, based on a total weight of the hard mask composition, and the solvent may be included in the composition in an amount of about 80 wt % to about 99 wt %, based on the total weight of the hard mask composition.

The solvent may include at least one selected from propyleneglycol monomethyl ether acetate (PGMEA), propyleneglycol monomethylether (PGME), cyclohexanone, and ethyl lactate.

The embodiments may also be realized by providing a method for forming a pattern, the method including providing a material layer on a substrate, forming a hard mask layer on the material layer such that the hard mask layer is prepared from a hard mask composition including a solvent, and a compound, the compound including a structural unit represented by the following Chemical Formula 1; forming a resist layer on the hard mask layer; forming a resist pattern by exposing and developing the resist layer; selectively removing a portion of the hard mask layer, using the resist pattern as a mask, to expose a portion of the material layer; and etching the exposed portion of the material layer,

[Chemical Formula 1]

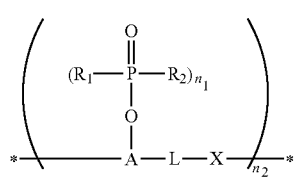

wherein in Chemical Formula 1, A is —CH— or a polyvalent aromatic ring group, X is a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, L is a single bond, a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $R_1$ and $R_2$ are each independently hydrogen, a hydroxyl group, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, and $n_1$ is an integer of 1 to 6, and $n_2$ is 1 to about 190.

A may be one selected from substituted or unsubstituted aromatic ring groups shown in the following Group 1:

[Group 1]

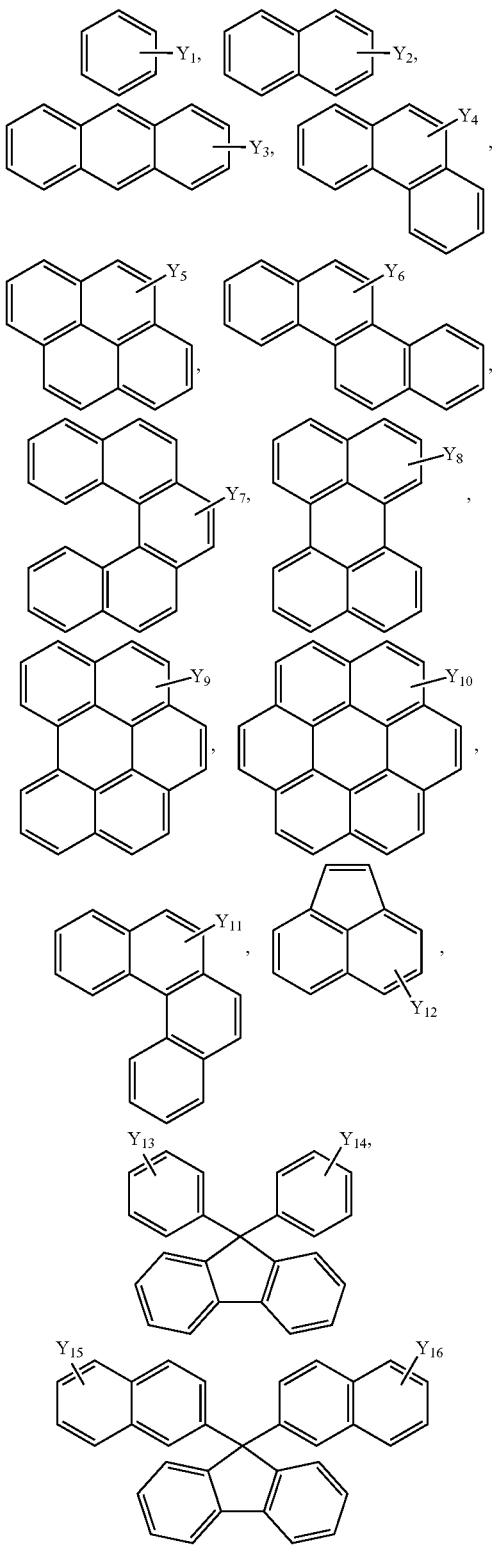

wherein, in Group 1, $Y_1$ to $Y_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

X may be one selected from substituted or unsubstituted aromatic ring groups shown in the following Group 2:

[Group 2]

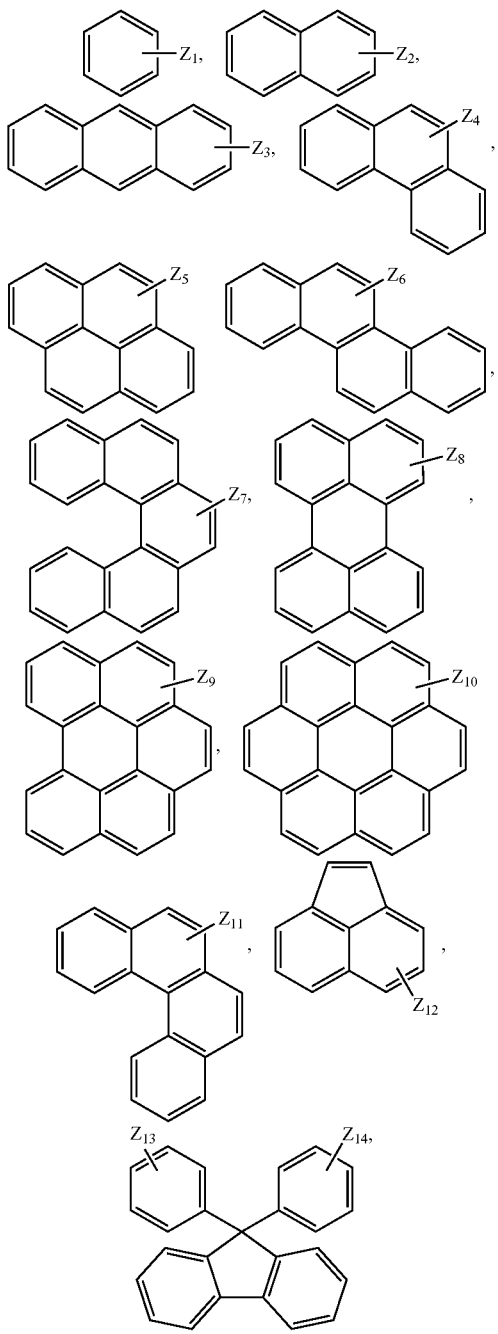

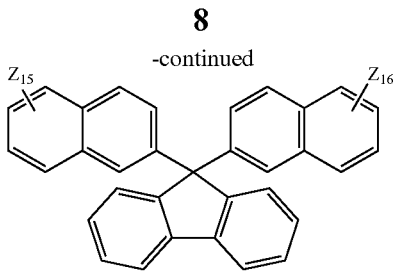

-continued wherein in Group 2, $Z_1$ to $Z_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

The compound may have a weight average molecular weight of about 2,000 to about 10,000.

The solvent may include at least one selected from propyleneglycol monomethyl ether acetate (PGMEA), propyleneglycol monomethylether (PGME), cyclohexanone, and ethyl lactate.

Forming the hard mask layer may include applying the hard mask layer composition by a spin-on-coating process.

The method may further include forming a silicon-containing auxiliary layer on the material layer prior to forming the resist layer.

The method may further include forming a bottom antireflective coating layer (BARC) prior to forming the hard mask layer.

The embodiments may also be realized by a semiconductor integrated circuit device comprising a pattern formed through the method according to an embodiment.

DETAILED DESCRIPTION

Korean Patent Application No. 10-2010-0129982, on Dec. 17, 2010, filed in the Korean Intellectual Property Office, and entitled: "Hardmask Composition and Method of Forming Patterns and Semiconductor Integrated Circuit Device Including the Patterns," is incorporated by reference herein in its entirety.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, when a definition is not otherwise provided, the term "substituted" may refer to one substituted with at least a substituent selected from a halogen (F, Br, Cl, or I), a hydroxy group, a C1 to C20 alkoxy group, a nitro group, a cyano group, an amino group, an azido group, an amidino group, a hydrazino group, a hydrazono group, a carbonyl group, a carbamyl group, a thiol group, an ester group, an carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C20 cycloalkyl group, a C3 to C15 cycloalkenyl group, a C6 to C15 cycloalkynyl group, a C1 to C20 heterocycloalkyl group, and a combination thereof.

As used herein, when a definition is not otherwise provided, the prefix "hetero" may refer to one including 1 to 3 heteroatoms selected from N, O, S, and P.

Hereinafter, a hard mask composition according to an embodiment is described.

According to the embodiment of this disclosure, the hard mask composition may include a compound, e.g., an aromatic ring-containing compound, and a solvent.

The compound may include a structural unit represented by the following Chemical Formula 1.

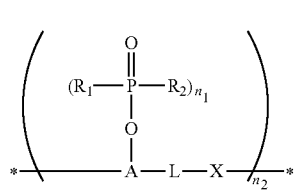

[Chemical Formula 1]

In Chemical Formula 1, A may be —CH— or a polyvalent aromatic ring. The aromatic ring group may refer to a cyclic group where electrons are delocalized or resonanced, and may include an aryl group, a heteroaryl group, or a combination thereof.

In an implementation, A may be a polyvalent aromatic ring group selected from substituted or unsubstituted aromatic ring groups shown in the following Group 1.

[Group 1]

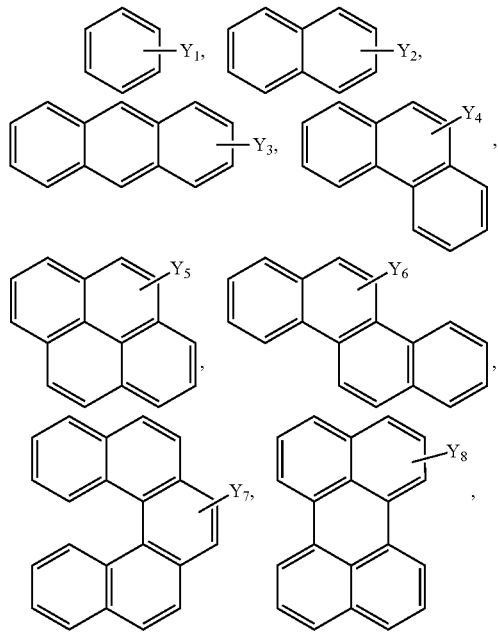

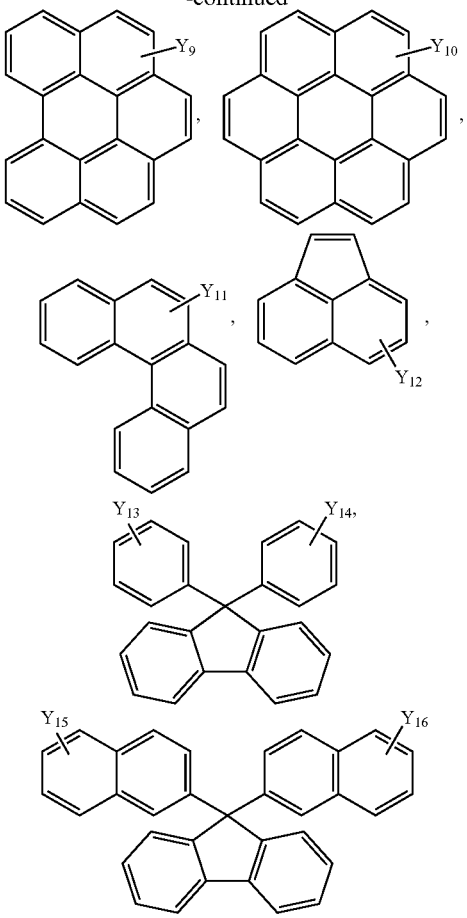

In Group 1, $Y_1$ to $Y_{16}$ may each independently be hydrogen, or a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof. For example, when the aromatic ring groups of Group 1 are "substituted," at least one of the above described substituents (except hydrogen) may independently substitute at least one hydrogen of the aromatic ring group.

The aromatic ring group of Group 1 may be linked to a portion of the above Chemical Formula 1 at any position of the groups of Group 1 without limitation.

X may be a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof.

When X is the substituted or unsubstituted C6 to C30 arylene group, X may be one selected from the substituted or unsubstituted aromatic ring groups shown in the following Group 2.

[Group 2]

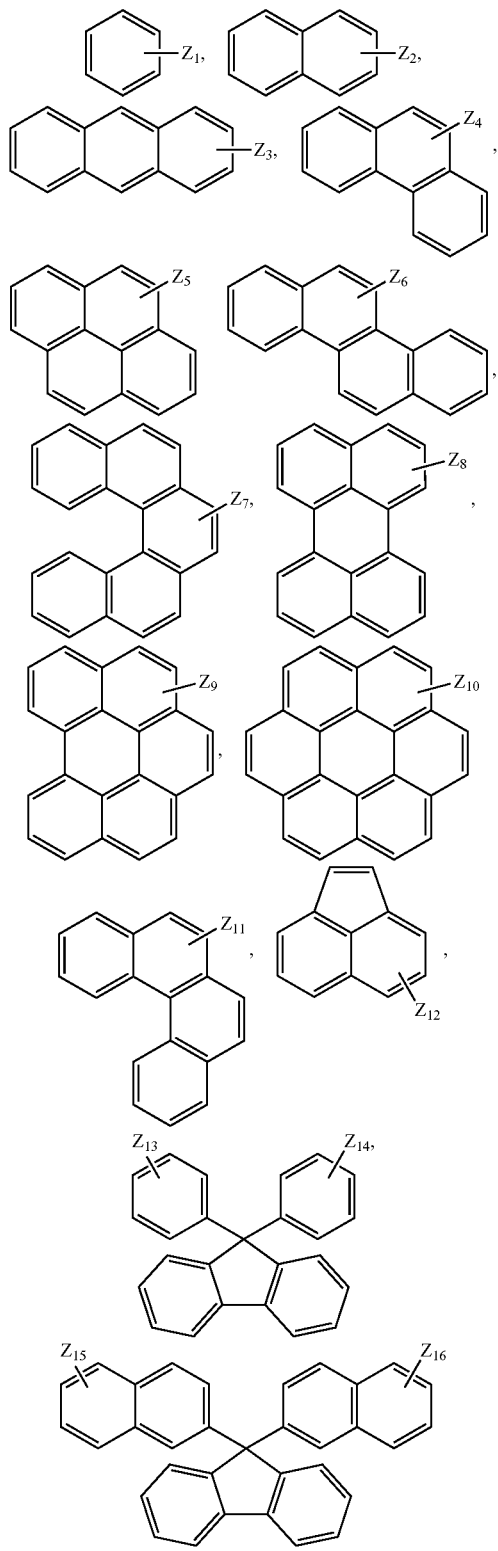

In Group 2, $Z_1$ to $Z_{16}$ may each independently be hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof. For example, when the aromatic ring groups of Group 2 are "substituted," at least one of the above-described substituents (except hydrogen) may independently substitute at least one hydrogen of the aromatic ring group.

The aromatic ring group of Group 2 may be linked to a portion of the above Chemical Formula 1 at any position of the groups of Group 2 without limitation.

L may be a linking group that links A and X, and may be, e.g., a single bond, a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof.

$R_1$ and $R_2$ may each independently be hydrogen, a hydroxyl group, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof.

$n_1$ may be an integer of 1 to 6; and $n_2$ may be 1 to about 190. For example, two phosphoryl groups may be bound to A for $n_1=2$.

When included, the aromatic ring group in Chemical Formula 1 may absorb light of a predetermined wavelength region. In an implementation, the light of the predetermined wavelength region may be a short wavelength region, e.g., about 193 nm and/or about 243 nm.

The compound may include two or more of the structural units (represented by Chemical Formula 1) including substituents different from each other or may include a mixture of two or more aromatic ring-containing compounds (including the structural units represented by Chemical Formula 1) having different substituents.

The compound may have a weight average molecular weight of about 2,000 to about 10,000. Maintaining the weight average molecular weight within the above range may help ensure that a good coating thickness can be realized by securing sufficient solubility. Thus, a good thin film may be provided.

The compound may be included in the composition in an amount of about 1 wt % to about 20 wt %, based on a total weight of the hard mask composition. In an implementation, the compound may be included in an amount of about 3 wt % to about 10 wt %, based on the total weight of the hard mask composition. Maintaining the amount of the compound within the range may help ensure that optical properties are improved while also ensuring good application characteristics.

The solvent is not particularly limited. The aromatic ring-containing compound should exhibit sufficient solubility or dispersion in the solvent. For example, the solvent may include at least one selected from propyleneglycol monomethyletheracetate (PGMEA), propyleneglycol monomethylether (PGME), cyclohexanone, and ethyl lactate.

The solvent may be included in the composition in an amount of about 80 wt % to about 99 wt %, based on the total weight of the hard mask composition. Maintaining the amount of the solvent within the range may help ensure stable solubility, thereby improving application properties.

The hard mask composition may further include an additive, e.g., a surfactant and/or a cross-linking agent.

The surfactant may include, e.g., an alkylbenzene sulfonate salt, an alkyl pyridinium salt, polyethylene glycol, or a quaternary ammonium salt, but is not limited thereto.

The cross-linking agent may promote self cross-linking. Examples of the cross-linking agent may include an amino resin, e.g., an etherificated amino resin; a glycoluril compound, e.g., a compound represented by the following Chemical Formula A1 or A2; a bisepoxy compound, e.g., a compound represented by the following Chemical Formula B; a melamine resin, for example, N-methoxymethyl melamine resin, N-butoxymethyl melamine resin, or a compound represented by the following Chemical Formula C; or a mixture thereof.

[Chemical Formula A1]

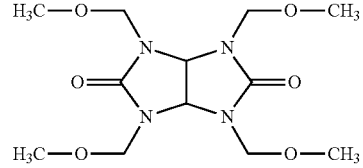

[Chemical Formula A2]

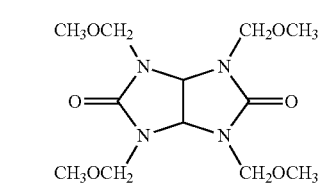

[Chemical Formula B]

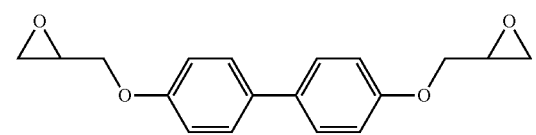

[Chemical Formula C]

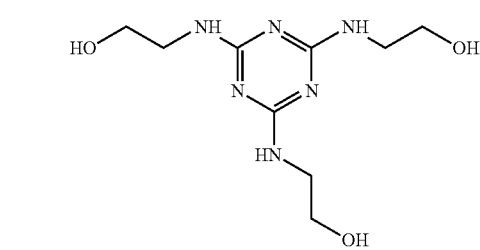

The surfactant and the cross-linking agent may be included in the composition in an amount of about 0.001 to about 1 part by weight, respectively, based on 100 parts by weight of the hard mask composition. Maintaining the amount of the surfactant and/or the cross-linking agent within the range may help ensure that good solubility and cross-linking are secured without changing the optical properties of the hard mask composition or the hard mask layer prepared therefrom.

Hereafter, a method for forming patterns by using the above-described hard mask composition is described.

The method of forming a pattern may include providing a material layer on a substrate, forming a hard mask layer on the material layer using the hard mask composition (including an, e.g., aromatic ring-containing, compound and a solvent), forming a resist layer on the hard mask layer, exposing and developing the resist layer to provide a resist pattern, selectively removing a portion of the hard mask layer using the resist pattern as a mask to expose a portion of the material layer, and etching the exposed portion of the material layer.

The substrate may be, e.g., a silicon wafer, a glass substrate, or a polymer substrate.

The material layer may be a material to be finally patterned, e.g., a metal layer (such as an aluminum layer and/or a copper layer), a semiconductor layer (such as a silicon layer), or an insulation layer (such as a silicon oxide layer and/or a silicon nitride layer). The material layer may be formed through a method such as sputtering or a chemical vapor deposition (CVD) process.

The hard mask layer may be formed by applying a hard mask composition. The hard mask composition may include the compound, e.g., the aromatic ring-containing compound, and the solvent, according to an embodiment.

The compound may include a structural unit represented by the following Chemical Formula 1.

[Chemical Formula 1]

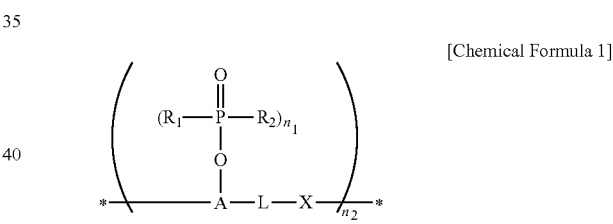

In Chemical Formula 1, A may be —CH— or a polyvalent aromatic ring. The aromatic ring group may refer to a cyclic group where electrons are delocalized or resonanced, and may include an aryl group, a heteroaryl group, or a combination thereof.

In an implementation, A may be a polyvalent aromatic ring group selected from substituted or unsubstituted aromatic ring groups shown in the following Group 1.

[Group 1]

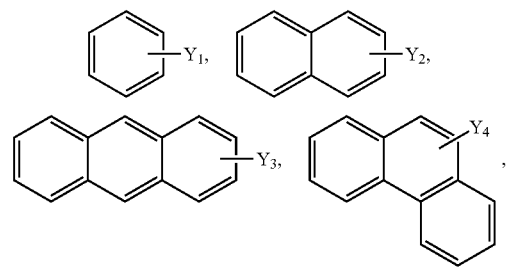

-continued

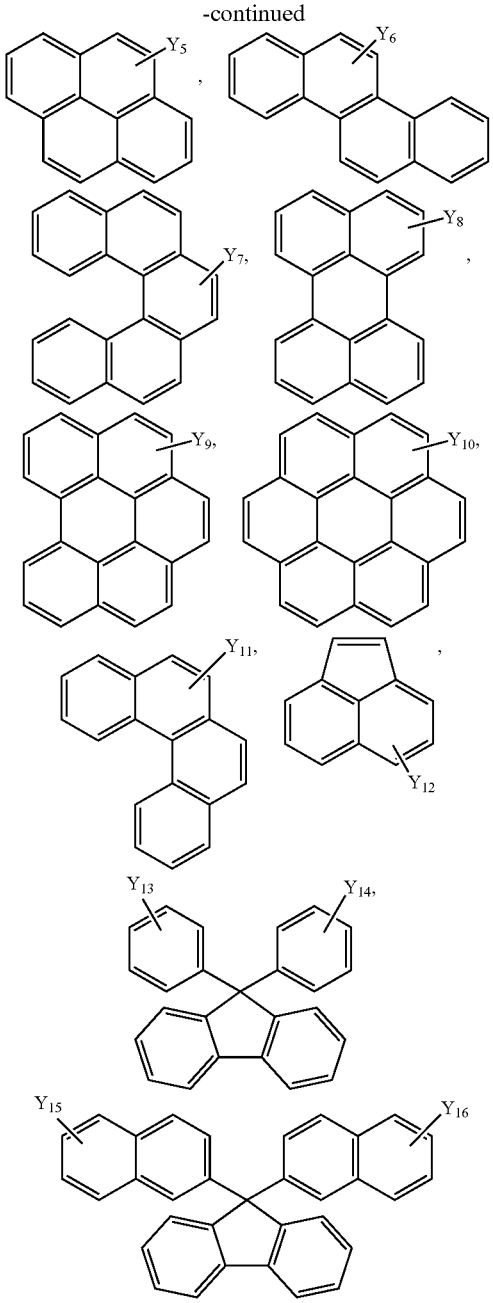

In Group 1, $Y_1$ to $Y_{16}$ may each independently be hydrogen, or a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof. For example, when the aromatic ring groups of Group 1 are "substituted," at least one of the above described substituents (except hydrogen) may independently substitute at least one hydrogen of the aromatic ring group.

The aromatic ring group of Group 1 may be linked to a portion of the above Chemical Formula 1 at any position of the groups of Group 1 without limitation.

X may be a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof.

When X is the substituted or unsubstituted C6 to C30 arylene group, X may be one selected from the substituted or unsubstituted aromatic ring groups shown in the following Group 2.

[Group 2]

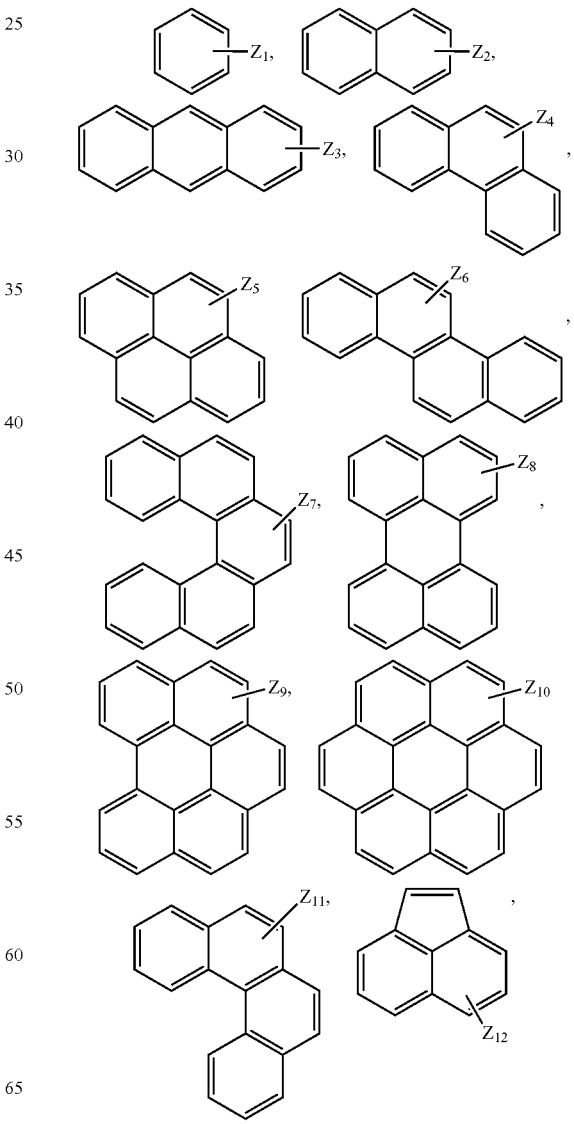

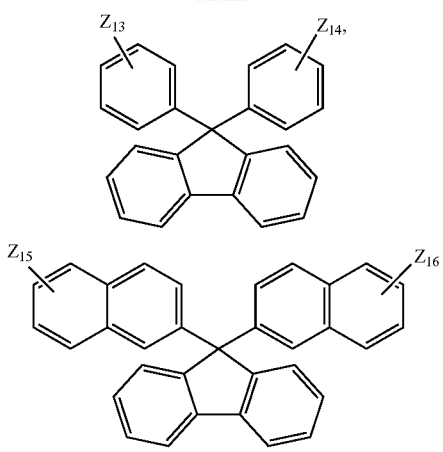

In Group 2, $Z_1$ to $Z_{16}$ may each independently be hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof. For example, when the aromatic ring groups of Group 2 are "substituted," at least one of the above-described substituents (except hydrogen) may independently substitute at least one hydrogen of the aromatic ring group.

The aromatic ring group of Group 2 may be linked to a portion of the above Chemical Formula 1 at any position of the groups of Group 2 without limitation.

L may be a linking group that links A and X, and may be, e.g., a single bond, a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof.

$R_1$ and $R_2$ may each independently be hydrogen, a hydroxyl group, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof.

$n_1$ may be an integer of 1 to 6; and $n_2$ may be 1 to about 190.

When included, the aromatic ring group in Chemical Formula 1 may absorb light of a predetermined wavelength region. In an implementation, the light of the predetermined wavelength region may be a short wavelength region, e.g., about 193 nm and/or about 243 nm.

The compound may include two or more of the structural units (represented by Chemical Formula 1) including substituents different from each other or may include a mixture of two or more aromatic ring-containing compounds (including the structural units represented by Chemical Formula 1) having different substituents.

The compound may have a weight average molecular weight of about 2,000 to about 10,000. Maintaining the weight average molecular weight within the above range may help ensure that a good coating thickness can be realized by securing sufficient solubility. Thus, a good thin film may be provided.

The compound may be included in the composition in an amount of about 1 wt % to about 20 wt %, based on a total weight of the hard mask composition. In an implementation, the compound may be included in an amount of about 3 wt % to about 10 wt %, based on the total weight of the hard mask composition. Maintaining the amount of the compound within the range may help ensure that optical properties are improved while also ensuring good application characteristics.

The solvent is not particularly limited. The aromatic ring-containing compound should exhibit sufficient solubility or dispersion in the solvent. For example, the solvent may include at least one selected from propyleneglycol monomethyletheracetate (PGMEA), propyleneglycol monomethylether (PGME), cyclohexanone, and ethyl lactate.

The solvent may be included in the composition in an amount of about 80 wt % to about 99 wt %, based on the total weight of the hard mask composition. Maintaining the amount of the solvent within the range may help ensure stable solubility, thereby improving application properties.

The hard mask composition may further include an additive, e.g., a surfactant and/or a cross-linking agent.

The hard mask composition may be prepared in the form of a solution and applied through a spin-on-coating process. Subsequently, the applied composition may undergo a heat treatment so as to form the hard mask layer.

In the method, a coating thickness of the hard mask composition and conditions of the heat treatment are not specifically limited. For example, the hard mask composition may be applied to a thickness of about 500 to 7,000 Å; and the heat treatment may be performed at about 100 to about 500° C. for about 10 seconds to about 10 minutes.

Before the hard mask layer is formed, another auxiliary layer may be formed. In an implementation, the auxiliary layer may be a silicon-containing thin film. For example, the auxiliary layer may be a thin film formed of silicon nitride or silicon oxide.

In another implementation, before forming the auxiliary layer, a bottom anti-reflective coating (BARC) layer may be further formed.

Subsequently, a resist layer may be applied onto the hard mask layer. The resist layer may be a radiation-sensitive imaging layer including a photosensitive material.

Subsequently, a resist pattern may be formed by exposing and developing the resist layer.

Subsequently, a portion of the hard mask layer may be selectively removed using the resist pattern as a mask. Herein, when the auxiliary layer and/or the bottom anti-reflective coating layer are formed, portions thereof may be removed together. As a result, a portion of the material layer may be exposed.

Subsequently, the exposed portion of the material layer may be etched. In an implementation, the etching may be performed through a dry etching process using an etching gas. The etching gas may be, e.g., $CHF_3$, $CF_4$, $CH_4$, $Cl_2$, $BCl_3$, or a mixed gas thereof.

Subsequently, a pattern formed of the material layer may be formed by removing the hard mask layer and the resist layer with a typical stripper.

The pattern may include, e.g., a metal pattern, a semiconductor pattern, or an insulation pattern, and may include diverse patterns inside a semiconductor integrated circuit device. When the semiconductor integrated circuit device includes the pattern, the patterns may be, e.g., metal lines, semiconductor patterns, or insulation layers including contact holes, bias holes, and damascene trenches.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of an Aromatic Ring-Containing Compound

SYNTHESIS EXAMPLE 1

76.4 g (0.35 mol) of 1-pyrenemethanol and 35.6 g of trioxane were dissolved in 182 g of 1,4-dioxane while inflowing nitrogen gas into a 500 ml, 4-neck flask equipped with a mechanical agitator, a condenser, and a nitrogen gas injecting tube to provide a solution, and the solution was agitated and reacted. After completing the reaction, the solution was condensed by an evaporator after removing acid using water. Subsequently, it was diluted using methanol to provide a solution with a concentration of 15 wt %. The solution was introduced into a 1 L separatory funnel and n-heptane was added to remove reaction side-products and to provide a polymer.

35 g of the obtained polymer and 10.65 g of diphenylphosphinic chloride were dissolved in 210 g of tetrahydrofuran (THF) while inflowing nitrogen gas into a 500 ml, 4-neck flask equipped with a mechanical agitator, a condenser, and a nitrogen gas injecting tube to provide a solution. The solution was agitated and reacted. After completing the reaction, the solution was condensed by an evaporator. After removing salt using water and dichloromethane, it was condensed by an evaporator to provide a solution with a concentration of 20 wt %. The solution was introduced into a 1 L separatory funnel and precipitated by adding n-heptane to provide a polymer including a structural unit represented by the following Chemical Formula 1a.

The polymer including a structural unit represented by the following Chemical Formula 1a had a weight average molecular weight of 3,200 and a polydispersity of 1.27.

[Chemical Formula 1a]

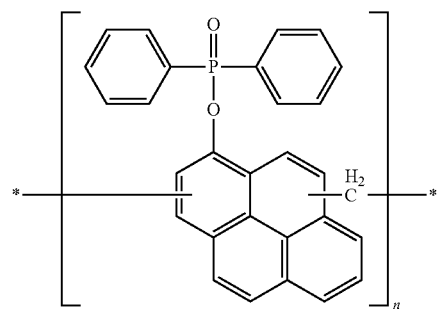

SYNTHESIS EXAMPLE 2

76.4 g (0.35 mol) of 1-pyrenemethanol and 35.6 g of trioxane were dissolved in 182 g of 1,4-dioxane to provide a solution while inflowing nitrogen gas into a 500 ml, 4-neck flask equipped with a mechanical agitator, a condenser, and a nitrogen gas injecting tube, and the solution was agitated and reacted. After 15 minutes, 9.32 g (0.049 mol) of pyridinium p-toluene sulfonate was slowly added into the solution and reacted at 100° C. for 12 hours. After completing the reaction, the solution was condensed by an evaporator after removing acid using water. It was diluted using methanol to provide a solution with a concentration of 15 wt %. The solution was introduced into a 1 L separatory funnel and n-heptane was added to remove reaction side-products and to provide a polymer.

35 g of the obtained polymer and 5.06 g of diphenylphosphinic chloride were dissolved in 181 g of tetrahydrofuran (THF) while inflowing nitrogen gas into a 500 ml, 4-neck flask equipped with a mechanical agitator, a condenser, and a nitrogen gas injecting tube to provide a solution. The solution was agitated and reacted. After 20 minutes, 5.46 g of triethylamine was slowly added into the solution and reacted for 6 hours. After completing the reaction and removing salt using water and dichloromethane, the solution was condensed by an evaporator to provide a solution with a concentration of 20 wt %. The solution was introduced into a 1 L separatory funnel and precipitated by adding n-heptane to provide a polymer including a structural unit represented by the following Chemical Formula 1b.

The polymer including a structural unit represented by the following Chemical Formula 1b had a weight average molecular weight of 4,300 and a polydispersity of 1.21.

[Chemical Formula 1b]

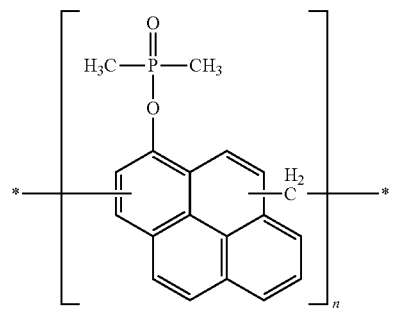

SYNTHESIS EXAMPLE 3

22.5 g (0.20 mol) of dimethylphosphonic chloride and 28.8 g of 2-naphthol were dissolved in 680 g of dichloromethane to provide a solution while inflowing nitrogen gas into a 1000 ml-4-neck flask equipped with a mechanical agitator, a condenser, and a nitrogen gas injecting tube, and the solution was agitated and reacted. After 15 minutes, 24.29 g of triethylamine was slowly introduced into the solution and reacted for 12 hours. After completing the reaction and removing salt using water and dichloromethane, the solution was condensed by an evaporator to provide a solution with a concentration of 20 wt %. The solution was introduced into a 1 L separatory funnel and precipitated by adding n-heptane to provide a polymer.

37.4 g of the obtained polymer and 12.2 g of paraformaldehyde were dissolved in 120 g of propyleneglycol monomethylether acetate (PGMEA) while inflowing nitrogen gas into a 500 ml, 4-neck flask equipped with a mechanical agitator, a condenser, and a nitrogen gas injecting tube to provide a solution. The solution was agitated and reacted. After 30 minutes, 1.62 g (0.0085 mol) of pyridinium p-toluene sulfonate was slowly added and reacted at 90° C. for 12 hours. After completing the reaction, the solution was condensed by an evaporator after removing acid using water. The solution was introduced into a 1 L separatory funnel and n-heptane was added to remove a low molecular weight material and to provide a polymer including a structural unit represented by the following Chemical Formula 1c.

The polymer including a structural unit represented by the following Chemical Formula 1c had a weight average molecular weight of 2,800 and a polydispersity of 1.22.

[Chemical Formula 1c]

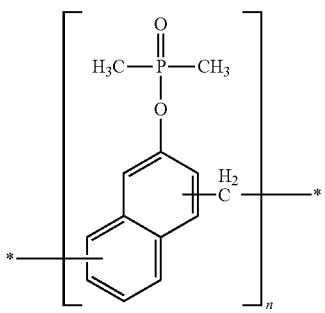

SYNTHESIS EXAMPLE 4

8.75 g (0.05 mol) of α,α'-dichloro-p-xylene and 26.66 g of aluminum chloride were dissolved in 200 g of γ-butyrolactone to provide a solution while inflowing nitrogen gas into a 500 ml, 4-neck flask equipped with a mechanical agitator, a condenser, and a nitrogen gas injecting tube, and the solution was agitated and reacted. After 10 minutes, a solution (in which 25.0 g (0.49 mol) of 4,4'-(9-fluorenylidene phosphinic acid monophenylester) was dissolved in 200 g of γ-butyrolactone) was slowly added dropwise into the solution and reacted for 6 hours. After completing the reaction, the solution was condensed by an evaporator after removing acid using water. It was diluted using methylamylketone/methanol (4/1 weight ratio) mixture to provide a solution with a concentration of 15 wt %. The solution was introduced into a 1 L separatory funnel and n-heptane was added to remove a low molecular weight material and to provide a polymer including a structural unit represented by the following Chemical Formula 1d.

The polymer including a structural unit represented by the following Chemical Formula 1d had a weight average molecular weight of 4,300 and a polydispersity of 1.18.

[Chemical Formula 1d]

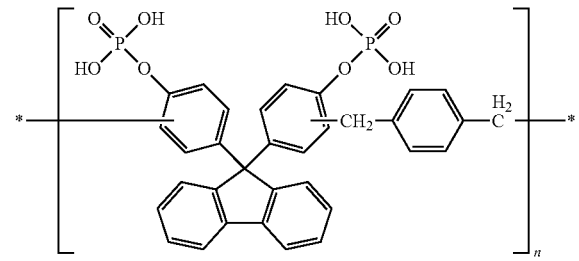

SYNTHESIS EXAMPLE 5

90.1 g (0.20 mol) of 4,4'-(9-fluorenylidenedinaphthalene) and 14.4 g of paraformaldehyde were dissolved in 248 g of propyleneglycol monomethylether acetate to provide a solution while inflowing nitrogen gas into a 500 ml, 4-neck flask equipped with a mechanical agitator, a condenser, and a nitrogen gas injecting tube, and the solution was agitated and reacted. After 15 minutes, 1.62 g (0.085 mol) of pyridinium p-toluene sulfonate was slowly added into the solution and reacted at 100° C. for 24 hours. After completing the reaction, the solution was condensed by an evaporator after removing acid using water. The solution was introduced into a 1 L separatory funnel and n-heptane was added to remove a low molecular weight material and to provide a polymer.

20 g of the obtained polymer and 5.02 g of dihydroxyphosphinic chloride were dissolved in 310 g of tetrahydrofuran (THF) while inflowing nitrogen gas into a 500 ml, 4-neck flask equipped with a mechanical agitator, a condenser, and a nitrogen gas injecting tube to provide a solution. The solution was agitated and reacted. After 20 minutes, 9.61 g of triethylamine was slowly added into the solution and reacted for 6 hours. After completing the reaction, the solution was condensed by an evaporator and salt was removed using water and dichloromethane, and then the solution was condensed again by an evaporator to provide a solution with a concentration of 20 wt %. The solution was introduced into a 1 L separatory funnel and precipitated by adding n-heptane to provide a polymer including a structural unit represented by the following Chemical Formula 1e.

The polymer including a structural unit represented by the following Chemical Formula 1e had a weight average molecular weight of 5,600 and a polydispersity of 1.23.

[Chemical Formula 1e]

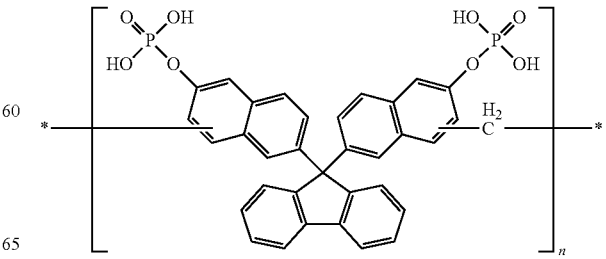

COMPARATIVE SYNTHESIS EXAMPLE 1

8.75 g (0.05 mol) of α,α'-dichloro-p-xylene, 26.66 g of aluminum chloride, and 200 g of γ-butyrolactone were put into 1 L, 4-neck flask equipped with a mechanical agitator, a condenser, a 300 ml dripping funnel, and then agitated while inflowing nitrogen gas to thereby prepare a mixed solution.

After 10 minutes, a solution prepared by dissolving 35.03 g (0.10 mol) of 4,4'-(9-fluorenylidene)diphenol in 200 g of γ-butyrolactone was slowly added dropwise into the above mixed solution for 30 minutes and agitated at for 12 hours to induce polymerization.

After the polymerization reaction was finished, acid was removed using water and condensed by using an evaporator. Subsequently, a polymerization product was diluted using methylamylketone and methanol, and then the concentration was adjusted again by adding a solution of a concentration of 15 wt % containing methylamylketone/methanol at a weight ratio of 4/1 thereto. A polymer having a structural unit represented by the following Chemical Formula 1f was obtained by putting the solution into a 3 L separatory funnel and adding n-heptane thereto so as to remove a low molecular weight material.

The polymer having a structural unit represented by the following Chemical Formula 1f had a weight average molecular weight of 12,000 and polydispersity of 2.0.

[Chemical Formula 1f]

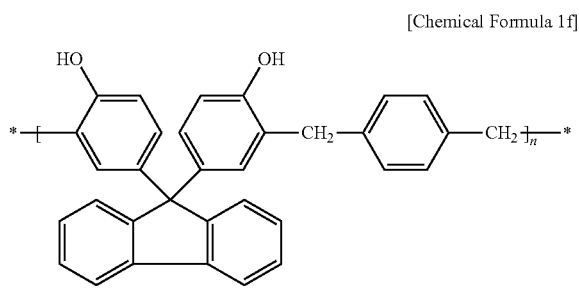 [SMILES: *Cc1ccc(Cc2cc(C3(c4ccc(O)c(*)c4)c4ccccc4-c4ccccc43)ccc2O)cc1]

Preparation of Hard Mask Composition

EXAMPLE 1

A hard mask composition was prepared by dissolving 1.0 g of the aromatic ring-containing compound obtained from Synthesis Example 1, 0.1 g of a glycoluril derivative cross-linking agent (Powerlink 1174) represented by the following Chemical Formula A2, and 100 mg of pyridinium p-toluene sulfonate in 9 g of cyclohexanone followed by filtering.

[Chemical Formula A2]

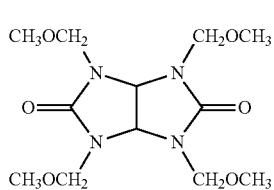

EXAMPLE 2

A hard mask composition was prepared according to the same method as Example 1, except that the aromatic ring-containing compound obtained from Synthesis Example 2 was used (instead of the aromatic ring-containing compound obtained from Synthesis Example 1).

EXAMPLE 3

A hard mask composition was prepared according to the same method as Example 1, except that the aromatic ring-containing compound obtained from Synthesis Example 3 was used (instead of the aromatic ring-containing compound obtained from Synthesis Example 1).

EXAMPLE 4

A hard mask composition was prepared according to the same method as Example 1, except that the aromatic ring-containing compound obtained from Synthesis Example 4 was used (instead of the aromatic ring-containing compound obtained from Synthesis Example 1).

EXAMPLE 5

A hard mask composition was prepared according to the same method as Example 1, except that the aromatic ring-containing compound obtained from Synthesis Example 5 was used (instead of the aromatic ring-containing compound obtained from Synthesis Example 1).

COMPARATIVE EXAMPLE 1

A hard mask composition was prepared according to the same method as Example 1, except that the aromatic ring-containing compound obtained from Comparative Synthesis Example 1 was used (instead of the aromatic ring-containing compound obtained from Synthesis Example 1).

Formation of Hard Mask Layer

Hard mask layers having a thickness of 1,500 Å were formed by applying the hard mask compositions of Examples 1 to 5 and Comparative Example 1 onto silicon wafers (on which a tetraethyl orthosilicate (TEOS) layer was formed), respectively, through a spin coating process, and baking them at 200° C. for 60 seconds.

Evaluation—1

Refractive indices (n) and extinction coefficients (k) of the hard mask layers formed of the hard mask compositions prepared according to Examples 1 to 5 were measured. The refractive indices and extinction coefficients were measured using an ellipsometer (produced by J.A. Woollam Company) while radiating light having a wavelength of 193 nm.

The measurement results are shown in the following Table 1

TABLE 1

| | Optical property at 193 nm | |
|---|---|---|
| | Refractive index (n) | Extinction coefficient (k) |
| Example 1 | 1.56 | 0.83 |
| Example 2 | 1.53 | 0.75 |
| Example 3 | 1.40 | 0.39 |
| Example 4 | 1.43 | 0.73 |
| Example 5 | 1.40 | 0.42 |

Referring to Table 1, the hard mask layers formed of the hard mask compositions of Examples 1 to 5 showed refractive indices (n) and extinction coefficients (k) that are appropriate for a hard mask layer with respect to light having a wavelength of 193 nm.

Formation of Resist Pattern

Hard mask layers having a thickness of 1,500 Å were formed by applying the hard mask compositions of Examples 1 to 5 and Comparative Example 1 onto silicon wafers (on which a tetraethyl orthosilicate (TEOS) layer was formed), respectively, through a spin coating process, and baking them at 200° C. for 60 seconds.

An upper surface of each hard mask layer was coated with a KrF-dedicated resist; and then the hard mask layers were baked at 110° C. for 60 seconds and exposed using ASML (XT:1450G, NA0.93), i.e., KrF exposure equipment. Subsequently, development with a 2.38 wt % tetramethylammonium hydroxide (TMAH) aqueous solution was performed.

Evaluation—2

Exposure latitude (EL) margins (according to variation of exposure amount) and depth of focus (DoF) margins (according to variation of distance from a light source) were observed. Also, whether undercut occurred in the patterned hard mask layer was observed using an FE-SEM.

The results are presented in the following Table 2.

TABLE 2

|  | EL margin (ΔCD/exposure energy, mJ) | DoF margin (μm) | Whether under-cut has occurred |
| --- | --- | --- | --- |
| Example 1 | 0.20 | 0.15 | X |
| Example 2 | 0.20 | 0.15 | X |
| Example 3 | 0.20 | 0.15 | X |
| Example 4 | 0.15 | 0.15 | X |
| Example 5 | 0.20 | 0.15 | X |
| Comparative Example 1 | 0.10 | 0.10 | ○ |

Referring to Table 2, the hard mask layer formed of the hard mask compositions of Examples 1 to 5 showed high EL margins and DoF margins, compared with the hard mask layer formed of the hard mask composition of Comparative Example 1. Also, no undercut was observed in the hard mask layers formed of the hard mask compositions of Examples 1 to 5. Instead, excellent profiles were observed.

Formation of Pattern

Dry-etching was performed using the patterned hard mask layer as a mask; and a mixed gas of $CHF_3/CF_4$, and then dry-etching once again using a mixed gas of $BCl_3/Cl_3$ was performed. Subsequently, the remaining organic materials were all removed using oxygen ($O_2$) gas.

Evaluation—3

The patterns of the tetraethyl orthosilicate (TEOS) layers were examined using an FE-SEM. The results are presented in the following Table 3.

TABLE 3

|  | Pattern profile of tetraethyl orthosilicate (TEOS) |
| --- | --- |
| Example 1 | Vertical shape (anisotropic) |
| Example 2 | Vertical shape (anisotropic) |
| Example 3 | Vertical shape (anisotropic) |
| Example 4 | Vertical shape (anisotropic) |
| Example 5 | Vertical shape (anisotropic) |
| Comparative Example 1 | Tapered shape, rough surface |

It may be seen from Table 3 that the hard mask layer formed of the hard mask composition of Comparative Example 1 and the tetraethyl orthosilicate layers under the hard mask layer were not isotropically patterned in vertical shapes, but rather were tapered or coarse. The hard mask layers formed of the hard mask compositions of Examples 1 to 5 and the tetraethyl orthosilicate layers under the hard mask layers were all isotropically patterned in vertical shapes.

It may be seen that when the hard mask compositions prepared according to Examples 1 to 5 were used, resistance against the etching gas was sufficient and the etching process was excellently performed. On the other hand, when the hard mask composition prepared according to Comparative Example 1 was used, resistance against the etching gas was not sufficient, which led to insufficient etching selectivity to pattern the tetraethyl orthosilicate in an appropriate shape.

By way of summation and review, the hard mask layer may undergo a lithography technique and thus may have high etch selectivity, sufficient resistance against multiple etching processes, and may minimize reflectivity between the resist and the layer under the hard mask layer. A pattern formed using such a hard mask composition may have improved optical properties.

Thus, thee embodiments provide a hard mask composition for preparing a hard mask layer having high etching selectivity, improved optical properties, and resistance for multi-etching.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A hard mask composition, comprising:
a solvent; and
a compound including a structural unit represented by the following Chemical Formula 1:

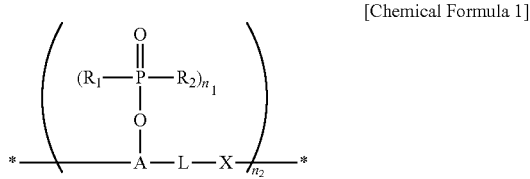

[Chemical Formula 1]

wherein, in Chemical Formula 1,

A is a polyvalent aromatic ring group,

X is a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C 1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, L is a single bond, a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $R_1$ and $R_2$ are each independently hydrogen, a hydroxyl group, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, and $n_1$ is an integer of 1 to 6, and $n_2$ is 1 to about 190.

2. The hard mask composition as claimed in claim 1, wherein A is one selected from substituted or unsubstituted aromatic ring groups shown in the following Group 1:

[Group 1]

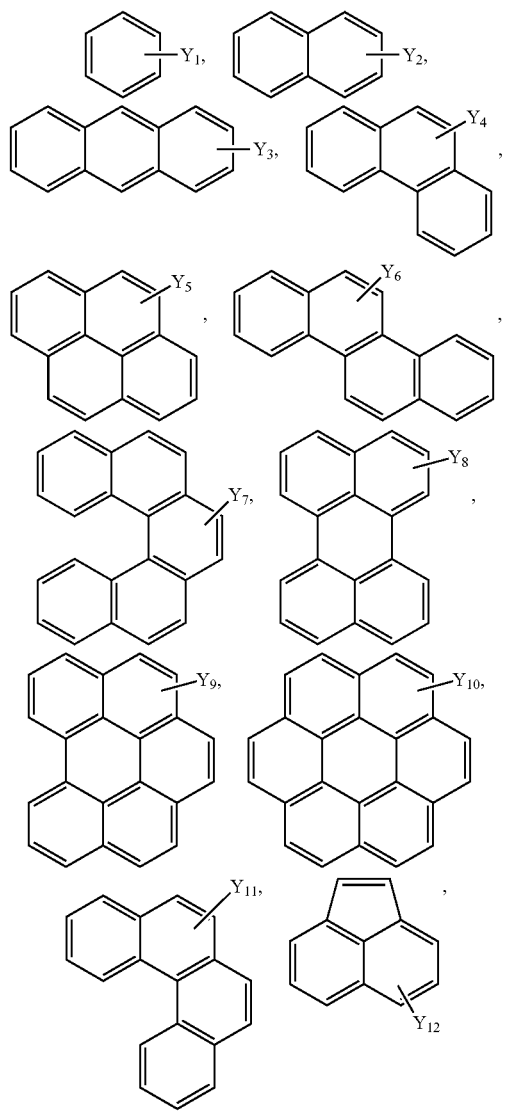

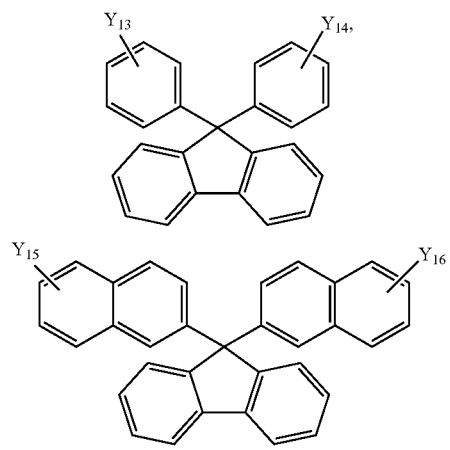

wherein, in Group 1, $Y_1$ to $Y_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C 1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

3. The hard mask composition as claimed in claim 1, wherein X is one selected from substituted or unsubstituted aromatic ring groups shown in the following Group 2:

[Group 2]

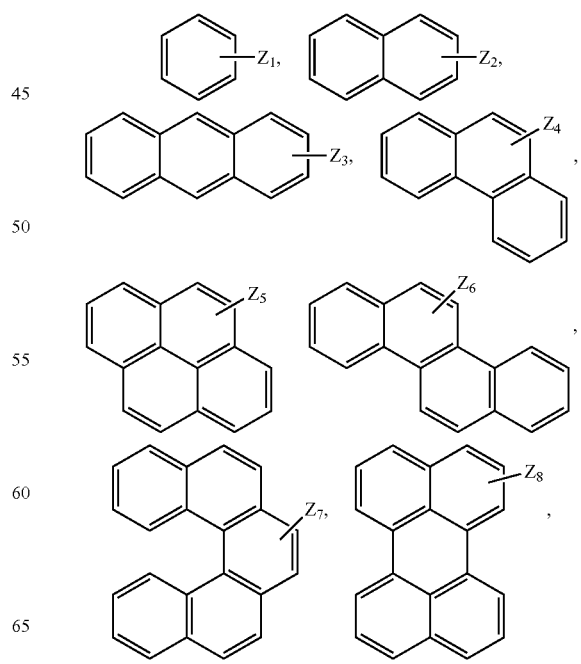

-continued

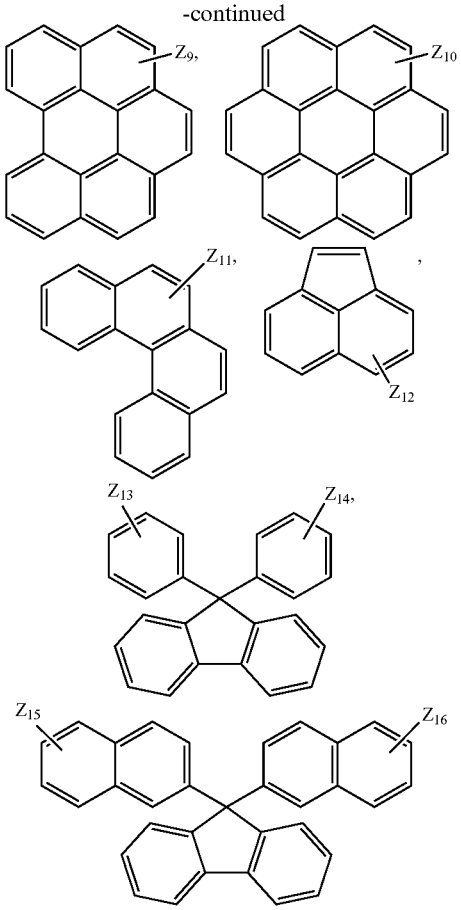

wherein in Group 2, $Z_1$ to $Z_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

4. The hard mask composition as claimed in claim 1, wherein the compound has a weight average molecular weight of about 2,000 to about 10,000.

5. The hard mask composition as claimed in claim 1, wherein:
the compound is included in the composition in an amount of about 1 wt % to about 20 wt %, based on a total weight of the hard mask composition, and
the solvent is included in the composition in an amount of about 80 wt % to about 99 wt %, based on the total weight of the hard mask composition.

6. The hard mask composition as claimed in claim 1, wherein the solvent includes at least one selected from propyleneglycol monomethyl ether acetate (PGMEA), propyleneglycol monomethylether (PGME), cyclohexanone, and ethyl lactate.

7. A method for forming a pattern, the method comprising providing a material layer on a substrate,
forming a hard mask layer on the material layer such that the hard mask layer is prepared from a hard mask composition including:
a solvent, and
a compound, the compound including a structural unit represented by the following Chemical Formula 1;
forming a resist layer on the hard mask layer;
forming a resist pattern by exposing and developing the resist layer;
selectively removing a portion of the hard mask layer, using the resist pattern as a mask, to expose a portion of the material layer; and
etching the exposed portion of the material layer,

[Chemical Formula 1]

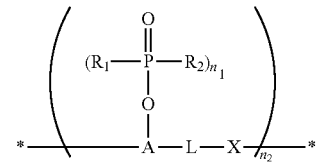

wherein in Chemical Formula 1,
A is a polyvalent aromatic ring group,
X is a substituted or unsubstituted C 1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof,
L is a single bond, a substituted or unsubstituted C1 to C20 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof,
$R_1$ and $R_2$ are each independently hydrogen, a hydroxyl group, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, or a combination thereof, and
$n_1$ is an integer of 1 to 6, and $n_2$ is 1 to about 190.

8. The method as claimed in claim 7, wherein A is one selected from substituted or unsubstituted aromatic ring groups shown in the following Group 1:

[Group 1]

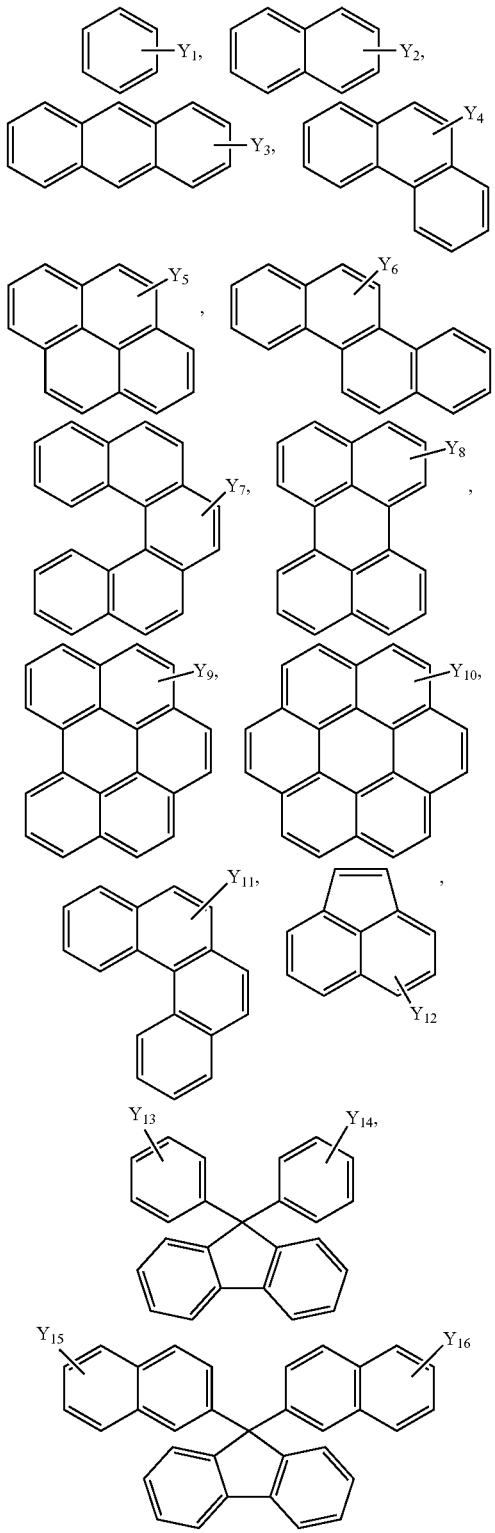

wherein, in Group 1, $Y_1$ to $Y_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

9. The method as claimed in claim 7, wherein X is one selected from substituted or unsubstituted aromatic ring groups shown in the following Group 2:

[Group 2]

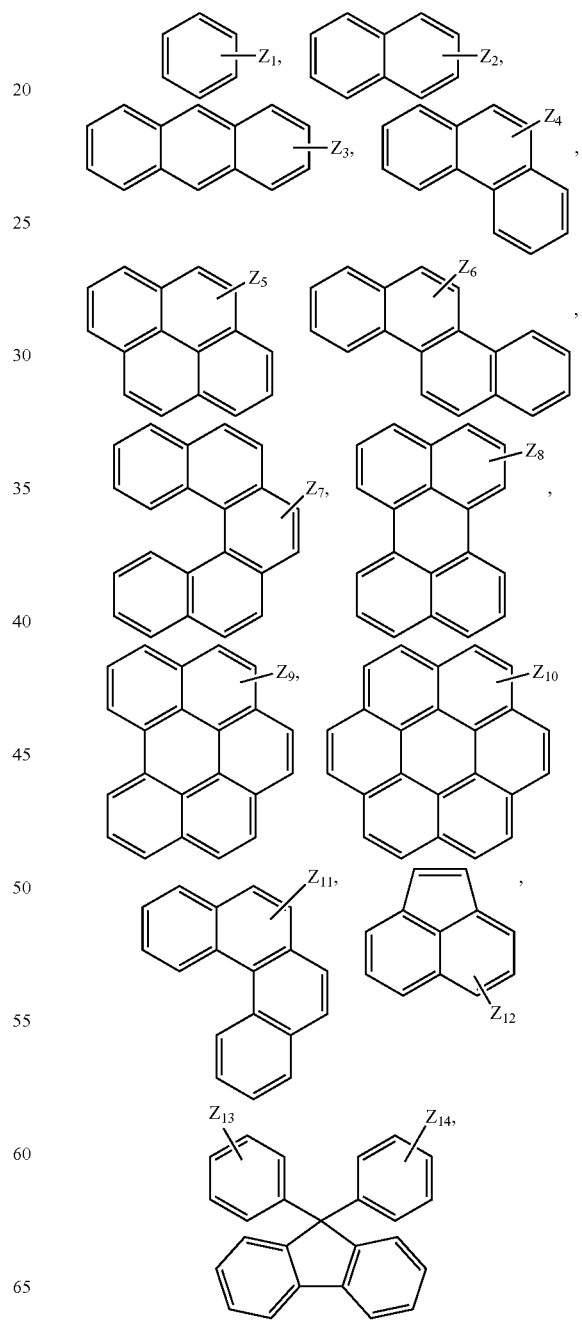

-continued

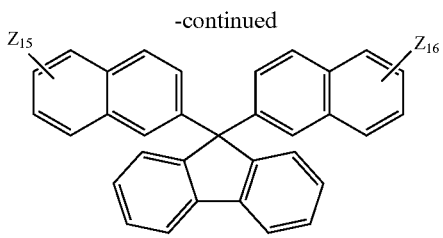

wherein in Group 2, $Z_1$ to $Z_{16}$ are each independently hydrogen, a hydroxyl group, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, a substituted or unsubstituted C1 to C30 alkoxy group, a halogen, or a combination thereof.

10. The method as claimed in claim 7, wherein the compound has a weight average molecular weight of about 2,000 to about 10,000.

11. The method as claimed in claim 7, wherein the solvent includes at least one selected from propyleneglycol monomethyl ether acetate (PGMEA), propyleneglycol monomethylether (PGME), cyclohexanone, and ethyl lactate.

12. The method as claimed in claim 7, wherein forming the hard mask layer includes applying the hard mask layer composition by a spin-on-coating process.

13. The method as claimed in claim 7, further comprising forming a silicon-containing auxiliary layer on the material layer prior to forming the resist layer.

14. The method as claimed in claim 13, further comprising forming a bottom antireflective coating layer (BARC) prior to forming the hard mask layer.

15. The hard mask composition as claimed in claim 1, wherein $R_1$ and $R_2$ are each independently hydrogen, a halogen, a substituted or unsubstituted C1 to C20 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof.

16. The hard mask composition as claimed in claim 1, wherein $R_1$ and $R_2$ are each independently a substituted or unsubstituted C1 to C20 alkyl group or a substituted or unsubstituted C6 to C30 aryl group.

* * * * *